(12) United States Patent
Lee et al.

(10) Patent No.: US 6,501,824 B1
(45) Date of Patent: Dec. 31, 2002

(54) X-RAY MASK WITH A MICRO-ACTUATOR

(75) Inventors: Seung Seob Lee, Kyungsangbuk-do (KR); Kwang-Cheol Lee, Kyungsangbuk-do (KR); Sang Jun Moon, Kyungsangbuk-do (KR)

(73) Assignee: Postech Foundation, Kyungsangbuk-do (KR)

( * ) Notice: Subject to any disclaimer, the term of this patent is extended or adjusted under 35 U.S.C. 154(b) by 0 days.

(21) Appl. No.: 10/046,170

(22) Filed: Jan. 16, 2002

(30) Foreign Application Priority Data

Sep. 4, 2001 (KR) .............................. 01-18561

(51) Int. Cl.$^7$ ................................ G21K 5/00
(52) U.S. Cl. ................................ 378/34; 378/35
(58) Field of Search ............... 378/34, 35; 216/12; 430/5

(56) References Cited

U.S. PATENT DOCUMENTS 6,379,871 B1 * 4/2002 Suzuki .................... 427/96
6,387,578 B1 * 5/2002 Lian et al. ................ 430/11

* cited by examiner

*Primary Examiner*—Drew A. Dunn
*Assistant Examiner*—Pamela R. Hobden
(74) *Attorney, Agent, or Firm*—Bacon & Thomas, PLLC

(57) ABSTRACT

An X-ray mask is integrated with a micro-actuator. The X-ray mask includes a mask portion, a mask holder portion, at least one elasticized supporter and a micro-actuator unit. The mask portion has a thin shuttle mass and an X-ray absorber attached on the shuttle mass. The mask holder portion is formed around the mask portion with a predetermined distance maintained therebetween. The elasticized supporter connects the mask portion and the mask holder portion elastically. The micro-actuator unit is prepared between the mask portion and the mask holder portion to precisely control a position of the mask portion when a voltage is applied.

4 Claims, 3 Drawing Sheets

X-RAY MASK WITH A MICRO-ACTUATOR

FIELD OF THE INVENTION

The present invention relates to an X-ray mask for use in an X-ray LIGA process; and, more particularly, to an X-ray mask with a micro-actuator for precisely controlling a position of the X-ray mask to generate a three-dimensional microstructure.

BACKGROUND OF THE INVENTION

In recent years, an X-ray LIGA technology by an X-ray mask is widely employed to fabricate a three-dimensional microstructure.

The term 'LIGA'is an acronym of German words Lithographie, Galvanoformung and Abformung which imply lithography, electroplating and molding, respectively. Therefore, the X-ray LIGA refers to a micro-fabrication technology for forming a microstructure through an X-ray lithography process, an electroplating process and a molding process.

By using the X-ray LIGA technology, a microstructure of vertical side wall with a height ranging from tens of $\mu m$ to several cm can be obtained. Since the roughness of the microstructure of vertical side wall is hundreds of Å, the microstructure fabricated by the X-ray LIGA process is highly precise.

The X-ray mask is a device for selectively eradiating the X-ray during the X-ray lithography process. The X-ray mask is located between a photoresist film and an X-ray source.

Referring to FIG. 1, there is provided a schematic front view of a conventional X-ray mask. The conventional X-ray mask includes a thin silicon/silicon nitride membrane 1 and an Au X-ray absorber 2 formed on the membrane 1. The X-ray permeates the silicon/silicon nitride membrane 1 without experiencing any energy loss but cannot pass through a region wherein the X-ray absorber 2 is prepared. Accordingly, the shape of the X-ray absorber 2 is transferred to a PMMA (polymethylmethacrylate) substrate or the photoresist film (not shown). The membrane 1 is supported by a mask holder 3. Above the X-ray mask is located the X-ray source (not shown) while beneath the X-ray mask is prepared the PMMA substrate or the photoresist film to be exposed to the X-ray.

Though the conventional X-ray mask as described above shows a great efficiency in fabricating a simple microstructure having a vertical sidewall, a three-dimensional microstructure with a non-vertical sidewall may not be easily fabricated by using the conventional X-ray mask. In order to obtain various three-dimensional microstructure by using the conventional X-ray mask, the X-ray mask or the PMMA substrate should be circularly or horizontally moved relative to the X-ray source. Accordingly, an additional precision equipment is required and, thus, the volume and the cost of the X-ray mask may not be reduced below a certain level.

SUMMARY OF THE INVENTION

It is, therefore, an object of the present invention to provide an X-ray mask incorporating therein a micro-actuator capable of directly operating the X-ray mask.

In accordance with the present invention, there is provided an X-ray mask with a micro-actuator including:

a mask portion including a thin shuttle mass and an X-ray absorber attached on the shuttle mass;

a mask holder portion formed around the mask portion with a predetermined distance maintained therebetween;

at least one elasticized supporter for elastically connecting the mask portion and the mask holder portion; and a micro-actuator unit prepared between the mask portion and the mask holder portion for precisely controlling a position of the mask portion when a voltage is applied.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
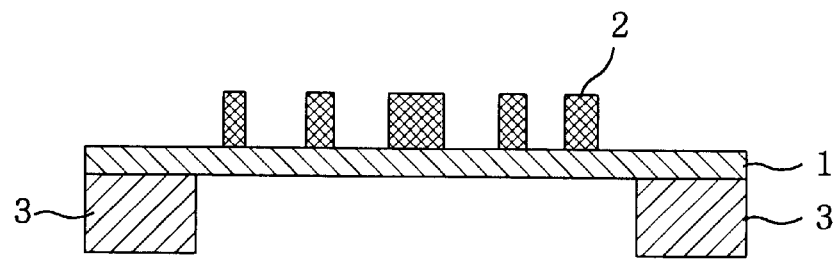
FIG. 1 is a schematic front view of a conventional X-ray mask.
Figure 2:
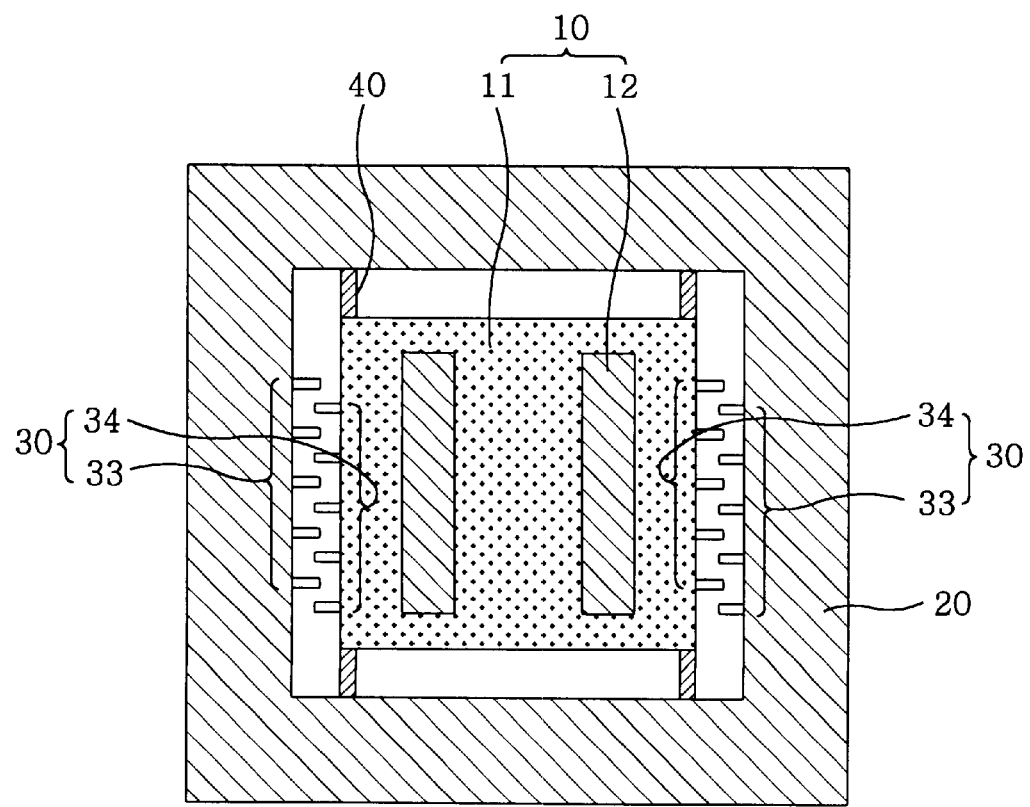
FIG. 2 provides a plane view of an X-ray mask with a micro-actuator in accordance with a first embodiment of the present invention.

Referring to FIG. 2, there is provided a plane view of an X-ray mask with a micro-actuator in accordance with a first embodiment of the present invention. The X-ray mask includes a mask portion 10, a mask holder portion 20, a micro-actuator unit 30 and elasticized supporters 40.

The mask portion 10 has a thin silicon shuttle mass 11 and an Au absorber 12 attached on the shuttle mass 11. The silicon shuttle mass 11 allows X-ray to pass therethrough without experiencing any energy loss while the Au absorber 12 absorbs the X-ray. Thus, the X-ray permeates a region on the shuttle mass 11 where no Au absorber 12 is formed and is used to eradiate a PMMA substrate or a photoresist film. In general, if the Au absorber 12 having a thickness of about 10 $\mu m$ is used, a photoresist film having a thickness of up to about 100 $\mu m$ can be exposed to the X-ray. If the thickness of the Au absorber 12 is increased, the exposed depth of the photoresist film may be further increased.

The mask holder portion 20 is located around the mask portion 10 with a predetermined distance intervened therebetween.

Between the mask portion 10 and the mask holder portion 20 are formed a plurality of elasticized supporters 40 in a Y-axis direction so that the mask portion 10 can move in an X-axis direction. To be more specific, four individual elasticized supporters 40 are connected from four external corners of the shuttle mass 11 to the mask holder portion 20 in the Y-axis direction. Accordingly, the shuttle mass 11 can move in the X-axis direction. Herein, it is also preferable that the elasticized supporters 40 are connected from the four external corners of the shuttle mass 11 to the four internal corners of the mask holder 20 in a diagonal direction.

The micro-actuator unit 30 includes a plurality of moving electrodes 34 and stationary electrodes 33, wherein the moving electrodes 34 are formed at an external left and an external right side of the mask portion 10 in the X-axis direction and the stationary electrodes 33 are formed at an internal left and an internal right side of the mask holder 20 in the X-axis direction. The moving electrodes 34 and the stationary electrodes 33 respectively have a comb type structure where each of the moving electrodes 34 is located with each of the stationary electrodes 33 by a predetermined distance. Herein, it is preferable that the moving electrodes 34 and the stationary electrodes 33 are alternately arranged. If a voltage is applied between the moving electrodes 34 and the stationary electrodes 33, the moving electrodes 34 may be displaced due to an electric potential difference between the moving electrodes 34 and the stationary electrodes 33 so that a precise control of the mask portion 10 can be realized.

As described above, the micro-actuator unit 30 of the present invention is an electrostatic actuator that may be operated by an electrostatic force. The micro-actuator unit 30 has a configuration wherein two electrodes are disposed facing each other with a minute gap intervened therebetween. The smaller the gap becomes, the more the electrostatic force on the surface of the electrodes 30 is increased in proportion to gravity. Accordingly, the position of the mask portion 10 can be more precisely adjusted.

Figure 3:
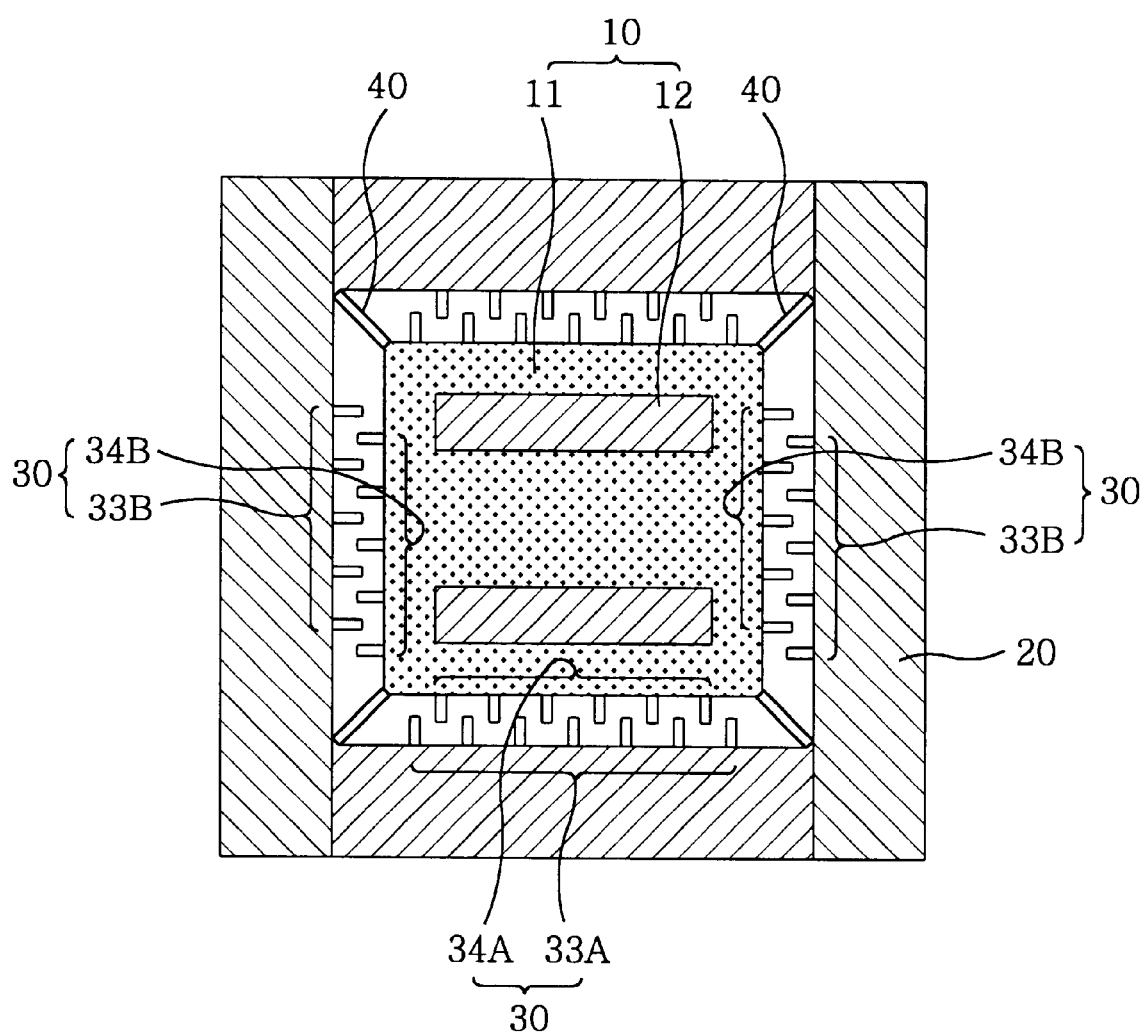
FIG. 3 sets forth a plane view of an X-ray mask with a micro-actuator in accordance with a second embodiment of the present invention.
Figure 4A:
FIGS. 4A to 4D respectively show a cross-sectional view of three-dimensional microstructures fabricated by using the X-ray mask with the micro-actuator in accordance with the present invention.
Figure 4B:
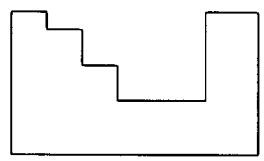
Figure 4C:
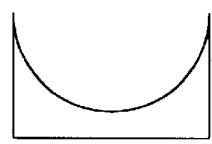
Figure 4D:
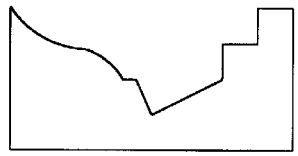

Referring to FIG. 3, there is provided a plane view of an X-ray mask with a micro-actuator in accordance with a second embodiment of the present invention. A plurality of moving electrodes 34A and 34B are formed around the mask portion 10, having a comb type structure. A plurality of stationary electrodes 33A and 33B are formed at four internal sides of the mask portion 20 to face each of the moving electrodes 34. The moving electrodes 34B and the stationary electrodes 33B which are disposed in a horizontal direction makes the mask portion 10 displaced in the X-axis direction while the moving electrodes 34A and the stationary electrodes 33A render the mask portion 10 displaced in the Y-axis direction. By such a mechanism, the position of the mask portion 10 can be effectively adjusted both in the X-axis direction and in the Y-axis direction. As shown in FIG. 3, it is preferable that the elasticized supporters 31 are connected from the four external corners of the shuttle mass 11 on the mask portion 10 to the four corresponding internal corners of the mask holder 20.

In the meanwhile, the X-ray mask having the micro-actuator in accordance with the present invention as described above may be readily fabricated by using conventional electroplating, photo-lithography and MEMS processes.

By using the X-ray mask with the micro-actuator in accordance with the present invention, a three-dimensional structure having a variety of shapes can be realized. FIGS. 4A to 4D respectively show a cross-sectional view of a microstructure that is fabricated by using the X-ray mask with the micro-actuator of the present invention. Specifically, by operating the micro-actuator during the X-ray lithography process, the amount of the X-ray eradiated to the PMMA substrate or the photoresist film is controlled such that various microstructures, e.g., a sloped wall having a certain inclined angle in FIG. 4A, a stepped wall having a plurality of heights in FIG. 4B, a curved wall having a certain curvature in FIG. 4C and a combination of the sloped wall, the curved wall and the stepped wall shown in FIG. 4D, can be fabricated.

While the invention has been shown and described with respect to the preferred embodiments, it will be understood by those skilled in the art that the various changes and modifications can be made without departing from the sprit and scope of the invention as defined in the following claims.

What is claimed is:

1. An X-ray mask with a micro-actuator comprising:

a mask portion including a thin shuttle mass and an X-ray absorber attached on the shuttle mass;

a mask holder portion formed around the mask portion with a predetermined distance maintained therebetween;

at least one elasticized supporter for elastically connecting the mask portion and the mask holder portion; and a micro-actuator unit prepared between the mask portion and the mask holder portion for precisely controlling a position of the mask portion when a voltage is applied.

2. The X-ray mask of claim 1, wherein the micro-actuator unit includes a plurality of moving electrodes formed along the external side of the mask portion and a plurality of stationary electrodes prepared along the internal side of the mask holder portion.

3. The X-ray mask of claim 1, wherein the moving electrodes and the stationary electrodes are alternately arranged with a predetermined distance intervened therebetween.

4. The X-ray mask of claim 1, wherein the elasticized supporters are connected from four external corners of the mask portion to four corresponding internal corners of the mask holder portion, respectively.

* * * * *